United States Patent [19]

Miller et al.

[11] Patent Number: 4,644,195
[45] Date of Patent: Feb. 17, 1987

[54] QUAD MULTI-CHANNEL SYNTHESIZER

[75] Inventors: Larry J. Miller, South Jordan; Richard K. Wells, Salt Lake City; Ronald B. Tippetts, Kaysville, all of Utah

[73] Assignee: Sperry Corporation, Blue Bell, Pa.

[21] Appl. No.: 632,637

[22] Filed: Jul. 20, 1984

[51] Int. Cl.$^4$ .......................... H03K 3/80; H03K 3/01
[52] U.S. Cl. .................................... 307/518; 307/271; 307/242; 328/104; 328/105; 328/109; 328/119; 328/60; 328/62; 328/137; 328/154
[58] Field of Search ............... 328/103, 104, 105, 108, 328/109, 119, 34, 60–63, 71, 137, 154; 307/518, 307/241–244, 271; 340/870.13

[56] References Cited

U.S. PATENT DOCUMENTS 4,306,190 12/1981 Beckwith et al. ..................... 328/62
4,475,085 10/1984 Yahata et al. .......................... 328/62

Primary Examiner—Stanley D. Miller
Assistant Examiner—Richard Roseen
Attorney, Agent, or Firm—G. Donald Weber, Jr.; Glenn W. Bowen

[57] ABSTRACT

A synthesizer circuit which generates a family of independent clock signals from multiple input clock signal sources under microprocessor control.

15 Claims, 1 Drawing Figure

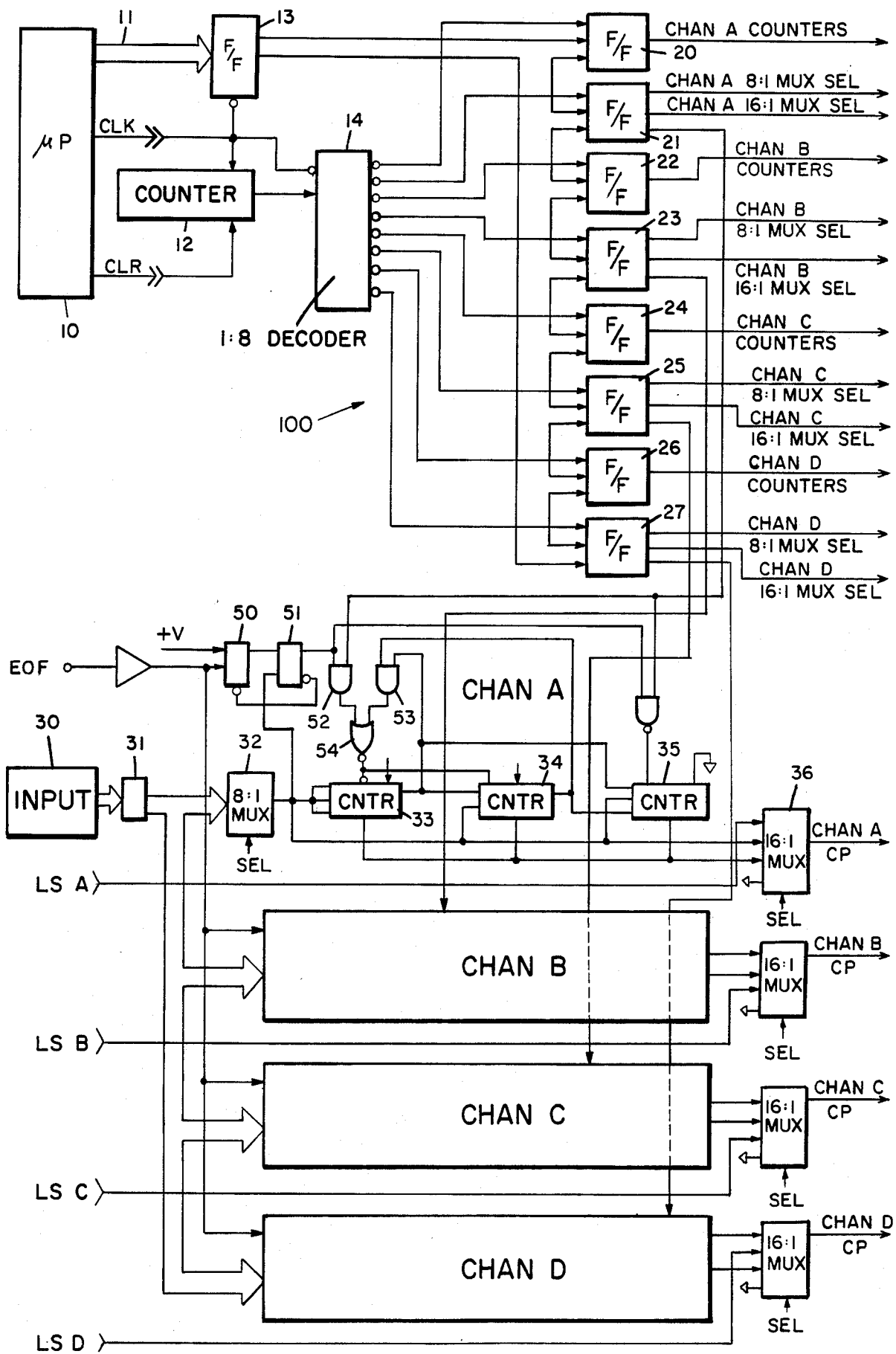

QUAD MULTI-CHANNEL SYNTHESIZER

BACKGROUND

1. Field of the Invention

This invention is directed at synthesizer circuits, in general, and to a TDM synthesizer which can interface to a number of users with different frequencies, in particular.

2. Prior Art

There are many synthesizers known in the art. However, they are very limited in their application. Typically, the synthesizers on the market have a single input. Sometimes they have more than one output. In order to provide a more general type of synthesizer it usually requires several circuit boards full of circuitry to generate the many channels worth of synthesizers.

Prior art devices consist of multiplexers, decoders, registers, drivers and many kinds of electronic devices including phase lock loops that drive counter chains, synchronizing circuits and the like. These elements have not been combined into one device to date.

SUMMARY OF THE INVENTION

This invention is directed to a time division multiplexer (TDM) synthesizer circuit which permits an interfacing with (or between) a plurality of users which can have different frequencies.

The circuit includes a holding register section which is arranged to receive and store signals from a microprocessor. The holding register section is connected to a plurality of channels for producing separate clock pulses which can be produced at different frequencies. The channels are selected and controlled by the signals stored in the holding register section.

BRIEF DESCRIPTION OF THE DRAWINGS

The sole FIGURE is a logic diagram of the synthesizer of the instant invention.

DESCRIPTION OF A PREFERRED EMBODIMENT

Referring to FIG. 1, there is shown an 8-bit microprocessor 10 which supplies signals on 8-bit bus 11 to the holding register 13. Holding register 13 is typically, comprised of flip-flops and temporarily stores the data from the microprocessor 10. However, before the microprocessor 10 has put data onto bus 11, it produces a peripheral select signal CLR, which is a low-going pulse that clears the counter 12. Then microprocessor 10 supplies an 8-bit data word to bus 11. With the counter 12 cleared, and the eight data bits on the bus 11, the microprocessor 10 produces a clock pulse, CLK, which is supplied to counter 12, register 13 and to the 1:8 decoder 14. Register 13 and decoder 14 are connected to supply most signals to holding register 100 which includes a plurality of registers 21 through 27. Each of these registers is, typically, comprised of flip-flop circuits.

When the counter 12 is cleared by the clear signal, the 1:8 decoder 14 is placed in its first decoded state which is associated with register 20, in this embodiment. That is, the count condition in counter 12 is decoded and decoder 14 selects register 20. Other counts in counter 12 will select other registers 21 through 27.

Thus, when the bus 11 is loaded, the clock signal CLK will clock the information into the 8-bit holding register 13 on the leading edge of pulse CLK and into 8-bit holding register 20 on the trailing edge of the pulse CLK. At the same time, the trailing edge of pulse CLK also increments counter 12 by one count. The next clock pulse CLK will then load the next data word on bus 11 (from microprocessor 10) into register 13, increment counter 12, and, in a timely fashion, cause decoder 14 to load the data word into the eight-bit register 21. This action will continue in response to further clock pulses. Thus, there is, essentially, a series of holding registers 20–27 arranged to hold the information that the microprocessor 10 is outputting. These registers will be used to provide the "divide by" function that is required, and select the appropriate input frequency and the appropriate output frequency to synthesize the clock signals.

The registers 20–27 are essentially permanent holding registers that retain information therein until the microprocessor reloads them again. The clear signal CLR starts the operation over again and causes the system to re-enter information which is merely written over the old information in registers 20–27. The information will remain in this bank of holding registers 20–27 until its physically changed.

The control network of the instant invention comprises a plurality of independent channels (in this embodiment channels A through D are shown) for supplying separate clock pulses (CHAN A CP; CHAN B CP; CHAN C CP; or CHAN D CP) to appropriate users (or utilization devices). Each of the channels is substantially identical and only one is described in detail. In particular, the control network includes an input device 30 which may comprise a number of phase lock loop devices which supply the input frequencies. These frequency signals are supplied to buffer 31 which is, typically, a transparent buffer and is used only to provide a driving (and isolating) function. The output of the buffer is connected to the 8:1 MUX 32 which is the input device for each of the respective channels. For purposes of convenience, the channels are identified as channels A, B, C and D.

The output of the 8:1 MUX 32 is connected to the input of counter 33. The output of counter 33 is connected, inter alia, to an input of counter 34. The output of counter 34 is connected, inter alia, to counter 35.

The output of MUX 32 and outputs of counters 33, 34 and 35 are connected to a 16:1 multiplexer 36. The output signal produced by multiplexer 36 is the clock pulse (CHAN A CP) for the particular channel, in this case channel A.

The output signals of the holding register 100 (registers 20–27) are effectively provided by 16 bits from each of two related registers (e.g. registers 20 and 21) which are connected to an associated frequency channel (e.g. channel A). These 16 bits are used for three distinct purposes. The signals control the frequency passed by the 8:1 MUX 32, the amount of division allowed by counters 33 and 34, and the output passed by the 16:1 MUX 36. Three of the bits are used to select which input frequency from source 30 is to be synthesized. These bits are supplied to multiplexer 32 which selectively transfers 1 of 8 frequency signals supplied thereto from input source 30 through buffer 31.

The frequencies in source 30 are, generally, provided via phase lock loops that are tracking a master clock. Multiple phase lock loops are required to generate the wide range of frequencies that are often required, (in this case there are 8 different frequencies). The 8:1 multiplexer is required on each channel to allow any frequency to be available for use by any channel. Thus, these frequencies from the input device 30 are supplied to the MUX 32 which makes the frequency selection.

The microprocessor information supplied by holding register 100 selects which one of those 8 frequencies will be allowed to pass through the multiplexer 32 into the divider chain in each channel. It should be noted that MUX 32 can be of a different ratio, e.g. 16:1, 32:1, or the like. However, it has been found that at least 8 frequencies are desirable in order to be able to synthesize a number of channels (on the order of 24) and be able to get all of the sub-frequencies out of the signals. It was determined that 8 frequencies would adequately cover the situations involved without being overly burdensome in terms of logic. The number of channels is selected by how many frequencies are controlled by the multiplexer and are not limited to the four as shown.

The 8:1 MUX requires three lines to be able to select one of the 8 input bits. Thus, three of the 16 control lines from register 100 are used to select which one of the frequencies is to be allowed to pass through MUX 32.

Another function of the signals provided by the holding register 100 is to determine the "divide by" number in the counter chain. Thus, eight of the bits are used to select the number by which the frequency from MUX 32 is to be divided, before it is allowed to go out of the channel.

The count which is loaded into counter 33 is derived from 4 of the 16 bits of the signal produced by the holding register flip-flops relating to channel A, in particular, registers 20 and 21 above.

Likewise, counter 34 and multiplexers 32 and 36 also receive 4 bits, 3 bits and 4 bits, respectively, of the 16-bit signal produced by the outputs of registers 20 and 21. It will be noted that, in this case, only 15 of the 16 bits from the registers are utilized with the other bit being not utilized for purposes of controlling the control circuit.

Thus, the information supplied by the microprocessor 10 is utilized to provide the control signals for selecting the frequency at the multiplexer 32 and determining the divide by numbers in the counters 33 and 34, as well as the output channel for multiplexer 36. It should be noted that counter 35 is always arranged to divide by 2, 4, 6, 8 or 16 in order to attempt to assure that the output signal is a square wave. The desired signal is selected by MUX 36.

Thus, if division by 1160 is desired, counters 33 and 34 would divide by 145 and counter 35 would divide by 8. This produces a symmetrical square wave signal CHAN A CP from multiplexer 36.

There are two preferred modes of operating this device. It has been found that many times it is desirable to synchronize the channel clock to the master frames of an external device. In order to do that, an end of frame pulse EOF is supplied to flip-flops 50 and 51 in order to synchronize to the internal clocking of this system. Whenever this occurs, it will reload the counters to a known state so that each one of the channel frequencies is synchronized to the signal frame of the device. Inasmuch as the frequencies herein are free running, they have no synchronization to the master system. The syncronization is obtainable only through the framing of the data of the EOF pulse. By using this arrangement, the synthesizer may be resynchronized with the system once every frame.

Another path through the circuit occurs whenever the counters 33 and 34 reach terminal count. In this case, the counters parallel feed back through the AND-/OR/INVERT function represented by AND gates 52 and 53 and NOR gate 54 to whatever state the microprocessor 10 is supplying thereto via registers 20 and 21. Thus, the counters 33 and 34 load back to a known state and continue to provide the proper "divide by" factor. This can be considered to be a rollover or a synchronizing function.

The channel clock output is provided by the 16:1 multiplexer 36. This MUX receives the 4 output bits of counter 33; the 4 output bits of counter 34; the 4 output bits of counter 35, as well as the output of the 8:1 MUX 32, which comes directly to the 16:1 MUX. In addition, a ground signal can be used in order to inhibit a clock on a particular channel, if so desired.

In addition, a separate signal such as a low speed clock (e.g. LSA) from an external source can be supplied to the 16:1 multiplexer 36. This signal is provided to the channel which then by-passes the phase lock loops and the entire synthesizing circuit. However, this signal provides a distinct clock that is generated by a microprocessor. This arrangement is useful if there are frequencies that are not divisible by 2 but are necessary in a device operating in a multiplexing capability. These clock signals are made as square as possible by the high part of the pulse being within plus or minus one clock pulse of the low part of the pulse. These pulses are always generated by counters and read-only-memories (ROM) operating at master clock frequencies.

Thus, there is shown and described a unique TDM synthesizer circuit. There are included in this description certain specific recitations of signals, counts, circuits and the like. Modifications thereto may be conceived by those skilled in the art. However, any such modifications which fall within the purview of this description are intended to be included therein as well. This description is intended to be illustrative only and is not intended to be limitative. The scope of the invention is limited only by the claims appended hereto.

We claim:

1. A synthesizer circuit comprising,
holding means (100) for holding a plurality of signals,
source mean for supplying signals to said holding means,
counter means (31-35) for receiving signals from said holding means to selectively alter the state of said counter means in response to changes in the plurality signals held by said holding means,
frequency signal supplying means (30) connected to supply frequency signals to said counter means such that the frequency of the signals supplied by said frequency signal supplying means is selectively divided by said counter means as a function of the signals supplied to said counter means by said holding means,
synchronizer means (E.O.F.) connected to said counter means in order to slectively synchronize said synthesizer circuit to an external means, and
multiplexer means (36) connected to receive a selection signal from said holding means and to receive a plurality of signals from said counter means and operative to determine which output signal is to be produced by said multiplexer means in response to said selection signal from said holding means.

2. The circuit recited in claim 1 wherein, said holding means includes a plurality of registers for storing signals therein.

3. The circuit recited in claim 2 including, decoder means for selecting the register for storing signals therein.

4. The circuit recited in claim 1 wherein, said counter means includes at least one divider circuit.

5. The circuit recited in claim 1 wherein, said synchronizer means includes logic circuit means connected to said counter means to selectively reset said counter means to a prescribed condition.

6. A signal controlling circuit comprising, source means operative to produce information signals and control signals, first register means for storing information signals from said source means in response to control signal from said source means, counter means connected to receive control signals from said source means and to produce output signals representative of said control signals, decoder means connected to receive said output signals from said counter means, second register means for storing information signals from said first register means in response to a selection by said decoder means, signal supplying means, and channel means connected to selectively transfer signals therethrough from said signal supplying means in accordance with signals stored in said second register means.

7. The circuit recited in claim 6 including, logic circuit means connected between said second register means and said channel means to control the transfer of signals through said channel means as a function of the information signals stored in said register means.

8. The circuit recited in claim 7 wherein, said channel means includes counter means connected to receive information signals from said logic circuit means.

9. The circuit recited in claim 6 wherein, said signal supplying means supplies input frequency signals.

10. The circuit recited in claim 9 wherein, said signal supplying means includes phase lock loop devices.

11. The circuit recited in claim 7 including, synchronizer means connected to said logic circuit means connected to said channel means to supply a synchronizing signal thereto.

12. The circuit recited in claim 6 wherein, said second register means stores information signals therein until new information signals are supplied thereto by said first register means.

13. The circuit recited in claim 6 including, multiplexer means connected to receive signals from said channel means and a selection control signal from said second register means.

14. The circuit recited in claim 13 including, low speed clock signal means connected to provide a specified low speed clock signal at an input of said multiplexer means which low speed clock signal is independent of the signals supplied by said signal supplying means.

15. The circuit recited in claim 1 wherein, said source means includes microprocessor means.

* * * * *